United States Patent
Li et al.

(10) Patent No.: US 9,073,212 B2
(45) Date of Patent: Jul. 7, 2015

(54) APPARATUS AND METHOD FOR TESTING PRINTED CIRCUIT BOARD

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Yong Li, Shenzhen (CN); Xi-Song Shuai, Shenzhen (CN); Yun-Qing Liu, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/261,444

(22) Filed: Apr. 25, 2014

(65) Prior Publication Data

US 2014/0350769 A1      Nov. 27, 2014

(30) Foreign Application Priority Data

May 27, 2013   (CN) .......................... 2013 1 0201465

(51) Int. Cl.
  *B25J 9/16* (2006.01)
  *H01L 21/66* (2006.01)
  *H01L 21/677* (2006.01)

(52) U.S. Cl.
  CPC ............... *B25J 9/1664* (2013.01); *H01L 22/14* (2013.01)

(58) Field of Classification Search
  CPC ... B25J 9/1664; H01L 22/14; H01L 21/27703
  USPC .......................................................... 701/25
  See application file for complete search history.

(56) References Cited

U.S. PATENT DOCUMENTS 8,588,763 B2 * 11/2013 Venkataraman .............. 455/423
  2014/0347080 A1 * 11/2014 Li et al. .................... 324/750.18

* cited by examiner

*Primary Examiner* — Mary Cheung
*Assistant Examiner* — Anne Mazzara
(74) *Attorney, Agent, or Firm* — Novak Druce Connolly Bove + Quigg LLP

(57) ABSTRACT

A printed circuit board testing method includes determining a position of a robot at a predetermined time interval and determining whether the determined position of the robot is within a preset position range. The method determines whether one or more shielding boxes are open according to unique identifiers of the shielding boxes stored in a storage system when the determined position of the robot is within the preset position range. The method obtains a predetermined path of each determined open shielding box from the storage system when one or more shielding boxes are open. The method further determines a shortest predetermined path among the obtained predetermined paths, and transmits a control signal including the determined predetermined path to the robot.

20 Claims, 3 Drawing Sheets

APPARATUS AND METHOD FOR TESTING PRINTED CIRCUIT BOARD

FIELD

The present disclosure relates to apparatuses, and particularly to an apparatus capable of improving a working efficiency of a robot.

BACKGROUND

A common PCB testing method for testing a radio frequency (RF) of PCBs employs a number of shielding boxes to respectively receive a number of PCBs to be tested (hereinafter to-be-tested PCBs). Before testing, a to-be-tested PCB must be carried into an open shielding box. However, in the common PCB testing method, one open shielding box is randomly selected when the number of the open shielding box is more than one, and a robot is employed to carry the to-be-tested PCB to the randomly selected open shielding box. However, a distance between the randomly selected open shielding box and the robot may be not shortest, which may influence the working efficient of the robot.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a plurality of" and "a number of" mean "at least two."

The embodiments of the present disclosure are now described in detail, with reference to the accompanying drawings.

Figure 1:
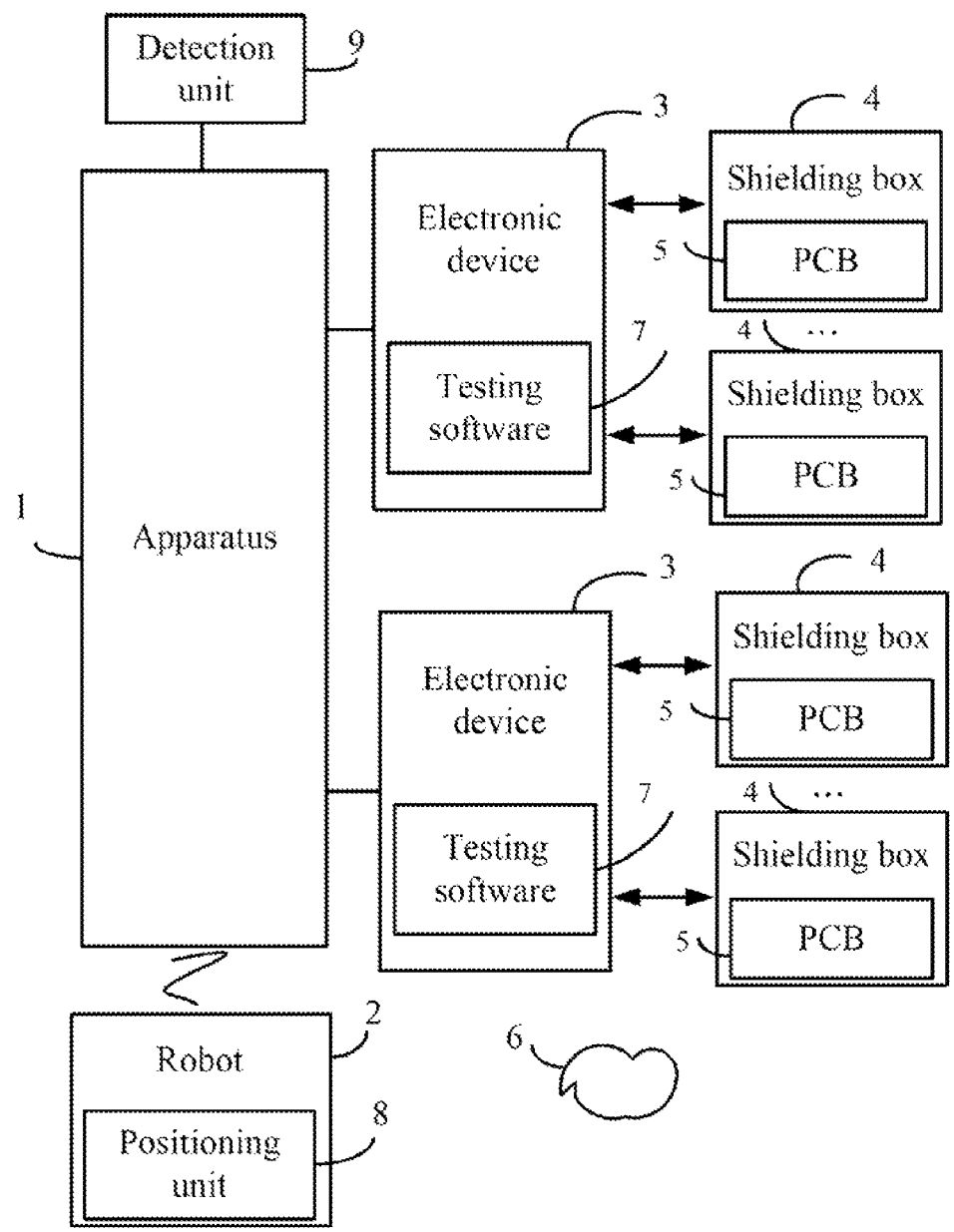
FIG. 1 is a schematic view of an embodiment of a working environment of an apparatus controlling a robot.
Figure 2:
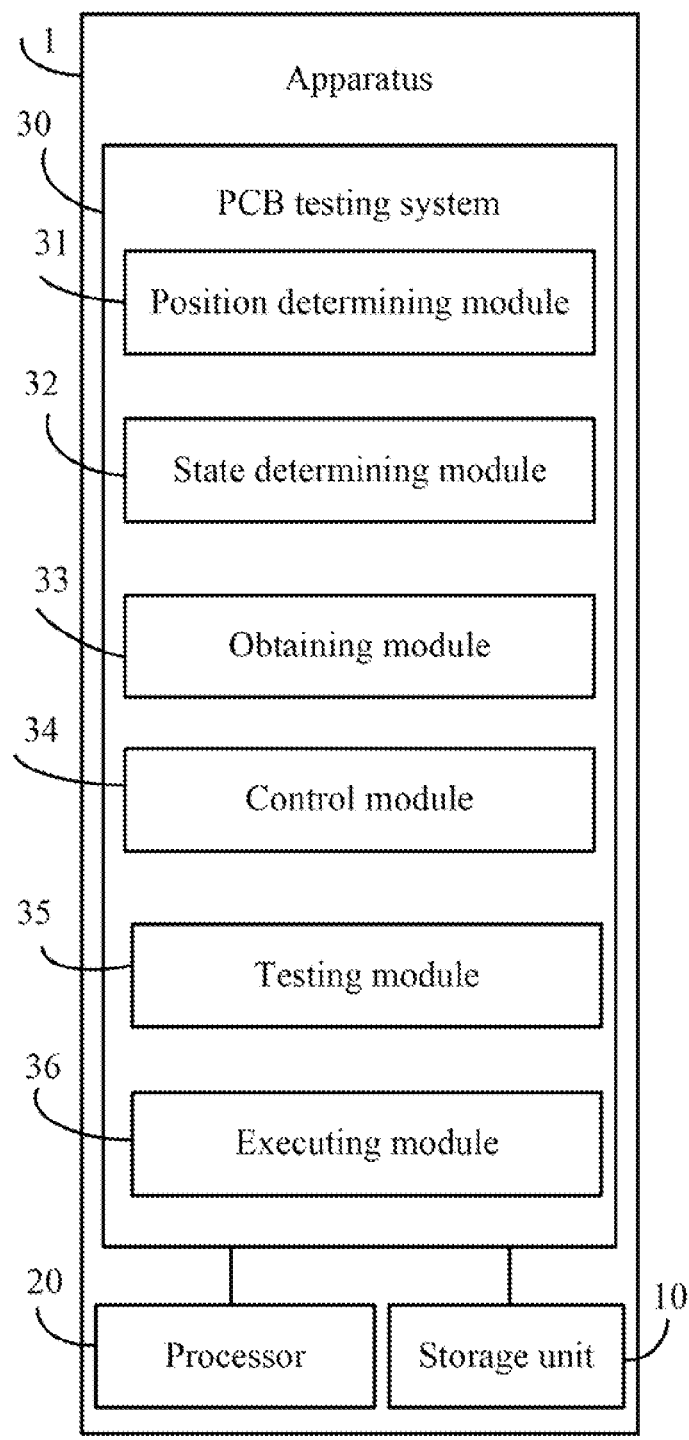
FIG. 2 is a block diagram of function modules of the apparatus of FIG. 1.

FIGS. 1-2 illustrate an embodiment of an apparatus 1. The apparatus 1 is connected to a robot 2 by a wireless mode, and can control the robot 2 to move and operate. The apparatus 1 is connected to one or more electronic devices 3 by a wired mode, such as via universal serial bus (USB) lines, fire lines, or network lines. The apparatus 1 can obtain information from the one or more electronic devices 3. Each electronic device 3 is connected to a number of shielding boxes 4 via a wired mode, such as via a number of USB lines. Each shielding box 4 receives a PCB 5 to be tested (hereinafter "to-be-tested PCB"). Each shielding box 4 includes a unique identifier.

In the embodiment, the apparatus 1 includes a storage unit 10. The storage unit 10 stores the unique identifier of each shielding box 4 and a predetermined path of each shielding box 4. The apparatus 1 determines which shielding boxes 4 are open according to the unique identifiers of the shielding boxes 4. When the shielding box 4 is open, the apparatus 1 marks the unique identifier corresponding to the open shielding box 4 to identify that the shielding box 4 is open. In the embodiment, the unique identifier of the shielding box can be marked through highlight the unique identifier of the shielding box or circled the unique identifier of the shielding box with a rectangle, and so on. The predetermined path of each shielding box 4 is a shortest path that the robot 2 moves along from a depot 6 to the corresponding shielding box 4. In the embodiment, the depot 6 stores a number of to-be-tested PCBs 5. A position of the depot 6 is in a preset position range, which includes a number of sets of coordinates in the Descartes coordinate system. When the robot 2 is within the preset position range, the robot 2 can be considered as grasping a to-be-tested PCB 5 stored in the depot 6 and preparing to carry the grasped to-be-tested PCB 5 to one open shielding box 4. In the embodiment, after the robot 2 carries the to-be-tested PCB 5 to the open shielding box 4, the robot 2 automatically returns to the depot 6. All the predetermined paths form a movement range of the robot 2, and the robot 2 can be controlled to move in the movement range.

Each PCB 5 includes a unique identifier. In the embodiment, the unique identifier of each PCB 5 is a serial number. A testing software 7 is installed in the electronic devices 3. Each electronic device 3 can utilize the testing software 7 to test the to-be-tested PCB 5. Before testing, the unique identifier of the to-be-tested PCB 5 is transmitted to the testing software 7, so that the testing software 7 can generate a testing result corresponding to the unique identifier of the to-be-tested PCB 5, and a user can accordingly know which PCB 5 passes or fails testing. In the embodiment, the apparatus 1 can determine which shielding boxes 4 are open according to the unique identifiers of the shielding boxes 4 when the position of the robot 2 is within the preset position range, obtain the predetermined paths corresponding to the determined open shielding boxes 4, determine a shortest predetermined path among all the obtained predetermined paths, and transmit a control signal including the determined predetermined path to the robot 2, to control the robot 2 to carry the to-be-tested PCB 5 to the shielding box 4 corresponding to the determined predetermined path.

In the embodiment, the apparatus 1 further includes a processor 20. A PCB testing system 30 is applied in the apparatus 1. In the embodiment, the PCB testing system 30 includes a position determining module 31, a state determining module 32, an obtaining module 33, and a control module 34. One or more programs of the above function modules can be stored in the storage unit 10 and executed by the processor 20. In general, the word "module," as used herein, refers to logic embodied in hardware or firmware, or to a collection of software instructions, written in a programming language. The software instructions in the modules can be embedded in firmware, such as in an erasable programmable read-only memory (EPROM) device. The modules described herein can be implemented as either software and/or hardware modules and can be stored in any type of computer-readable medium or other storage device. In the embodiment, the processor 20 can be a central processing unit, a digital processor, or a single chip, for example.

The position determining module 31 determines the position of the robot 2 at predetermined time interval and determines a set of coordinates of the robot 2 according to the position of the robot 2. In detail, in one embodiment, a positioning unit 8, such as a global positioning system (GPS) unit, is employed in the robot 2. The positioning unit 8 detects the position of the robot 2. Each point in the movement range of the robot 2 corresponds to one set of coordinates in the Descartes coordinate system. The position determining module 31 obtains the position of the robot 2 from the positioning unit 8 at the predetermined time interval and determines the set of coordinates of the robot 2 corresponding to the obtained position of the robot 2. In another embodiment, a detection unit 9, such as a touch screen, covers a ground corresponding to the movement range of the robot 2. Each point in the movement range of the robot 2 corresponds to one set of coordinates in the Descartes coordinate system. As the robot 2 moves on the detection unit 9, the position determining module 31 obtains the position of the robot 2 from the detection unit 9 at the predetermined time interval and determines the set of coordinates of the robot 2 corresponding to the obtained position of the robot 2. In the aforementioned embodiments, the position determining module 31 further determines whether the determined set of coordinates of the robot 2 is within the preset position range.

The state determining module 32 determines whether one or more shielding boxes 4 are open according to the unique identifiers of the shielding boxes 4 when the set of coordinates of the robot 2 is within the preset position range. In detail, the state determining module 32 searches the storage unit 10 for marked unique identifiers of the shielding boxes 4. If there is one or more marked unique identifiers of the shielding boxes 4 in the storage unit 10, the state determining module 32 determines that one or more shielding boxes 4 are open. If there is no marked unique identifier of the shielding box 4 in the storage unit 10, the state determining module 32 determines that no shielding box 4 is open.

The obtaining module 33 obtains the predetermined path of each determined open shielding box 4 from the storage unit 10 when one or more shielding boxes 4 are open.

The control module 34 determines a shortest predetermined path among the obtained predetermined paths, and the open shielding box 4 corresponding to the shortest predetermined path. The control module 34 transmits a control signal including the determined shortest predetermined path to the robot 2, to control the robot 2 to carry the to-be-tested PCB 5 from the depot 6 to the corresponding open shielding box 4, and place the to-be-tested PCB 5 into the corresponding open shielding box 4. When there is a PCB 5 that has just finished testing (hereinafter "tested PCB 5") in the shielding box 4, the control signal further includes a command to replace the tested PCB 5 with the to-be-tested PCB 5.

In the embodiment, the PCB testing system 30 further includes a testing module 35. The testing module 35 closes the corresponding open shielding box 4 after a predetermined time duration after the control module 34 transmits the control signal to the robot 2, and controls the testing software 7 to test the to-be-tested PCB 5 and generate the testing result corresponding to the unique identifier of the PCB 5. In the embodiment, the predetermined time is greater than or equal to a time duration that the robot 2 requires to carry the to-be-tested PCB 5 from the depot 6 to the determined open shielding box 4.

In the embodiment, the PCB testing system 30 further includes an executing module 36. The executing module 36 determines the unique identifier of the closed shielding box 4 of the tested PCB 5, and opens the closed shielding box 4 according to the determined unique identifier.

In the embodiment, the testing module 35 removes the mark of the unique identifier of the closed shielding box 4 from the storage unit 10 when the testing module 35 closes the open shielding box 4, and the executing module 36 further marks the determined unique identifier of the open shielding box 4 in the storage unit 10 when the executing module 36 opens the shielding box 4.

In the embodiment, the executing module 36 further records the testing result corresponding to the unique identifier of the PCB 5 in the storage unit 10.

Figure 3:
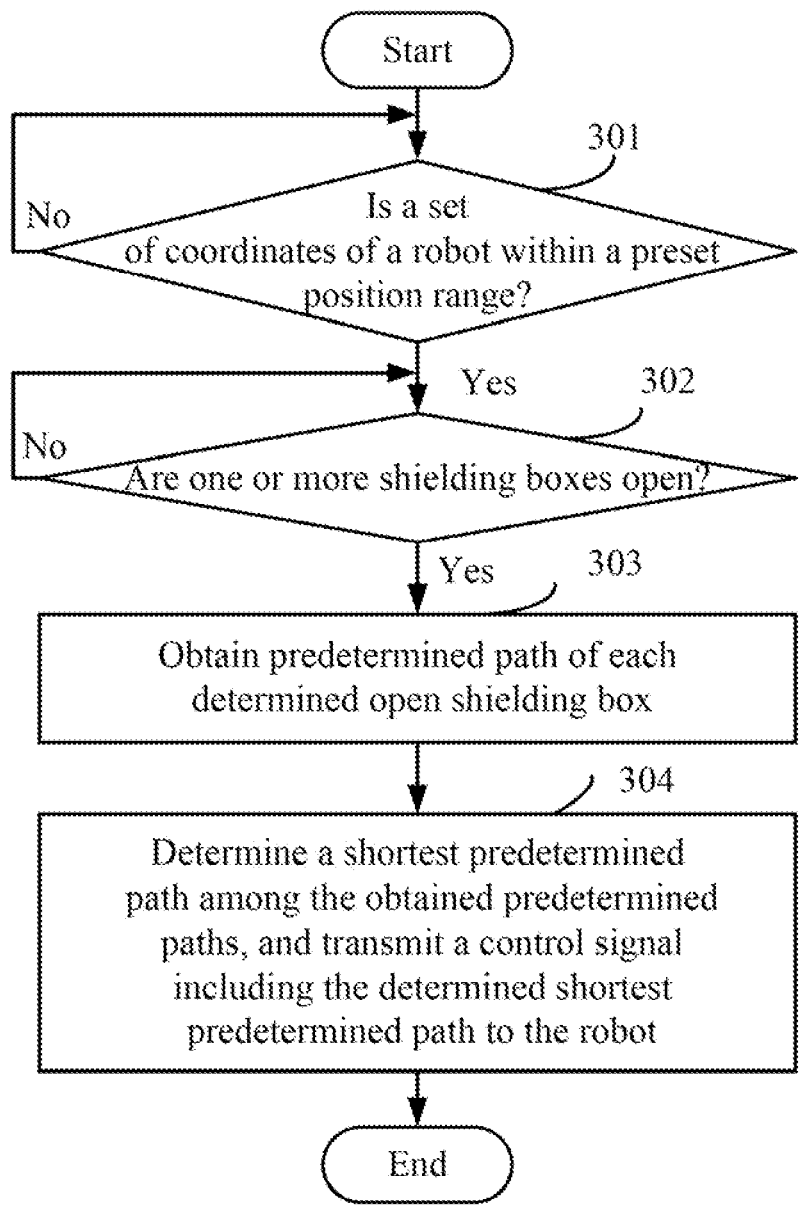
FIG. 3 is a flowchart of an embodiment of a PCB testing method.

FIG. 3 illustrates an embodiment of a flowchart of a PCB testing method.

In block 301, the position determining module 31 determines the position of the robot 2 at predetermined time interval and determines a set of coordinates of the robot 2 according to the position of the robot 2. The position determining module 31 further determines whether the determined set of coordinates of the robot 2 is within the preset position range. If the determined set of coordinates of the robot 2 is within the preset position range, the procedure goes to block 302. If the determined set of coordinates of the robot 2 is not within the preset position range, the procedure repeats block 301.

In block 302, the state determining module 32 determines whether one or more shielding boxes 4 are open according to the unique identifiers of the shielding boxes 4. If one or more shielding boxes 4 are open, the procedure goes to block 303. If no shielding box 4 is open, the procedure repeats block 302.

In block 303, the obtaining module 33 obtains the predetermined path of each determined open shielding box 4 from the storage unit 10.

In block 304, the control module 34 determines a shortest predetermined path among the obtained predetermined paths, and the open shielding box 4 corresponding to the shortest predetermined path. The control module 34 transmits a control signal including the determined shortest predetermined path to the robot 2, to control the robot 2 to carry the to-be-tested PCB 5 from the depot 6 to the corresponding open shielding box 4 and place the to-be-tested PCB 5 into the corresponding open shielding box 4. When there is a PCB 5 that has just finished testing (hereinafter "tested PCB 5") in the shielding box 4, the control signal further includes a command to replace the tested PCB 5 with the to-be-tested PCB 5.

In this way, when the distance between the robot 2 and one open shielding box 4 is shortest, the robot 2 can be controlled to carry the to-be-tested PCB 5 to the one open shielding box 4, thus, the to-be-tested PCBs 5 carried by the robot 2 during the preset time interval increases, which improves working efficiency of the robot 2.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. An apparatus connected to one or more electronic devices and a robot, each electronic device being connected to a plurality of shielding boxes, each shielding box being configured to receive a printed circuit board (PCB) to be tested, each shielding box comprising a unique identifier, the apparatus comprising:

a storage system storing a unique identifier of each shielding box and a predetermined path of each shielding box; the unique identifier of each of the shielding boxes being capable of being marked to identify that the shielding box is open; the predetermined path of each shielding box being a shortest path that the robot moves along from a depot which stores a plurality of PCBs to be tested to the corresponding shielding box; the position of the depot being a preset position range;

a processor;
one or more programs stored in the storage system, executed by the processor, the one or more programs comprising:
- a position determining module operable to determine a position of the robot at a predetermined time interval and determine whether the determined position of the robot is within the preset position range;
- a state determining module operable to determine whether one or more shielding boxes are open according to the unique identifiers of the shielding boxes when the determined position of the robot is within the preset position range;
- an obtaining module operable to obtain the predetermined path of each determined open shielding box from the storage system when one or more shielding boxes are open; and
- a control module operable to determine a shortest predetermined path among the obtained predetermined paths, and the open shielding box corresponding to the shortest predetermined path, and transmit a control signal comprising the determined shortest predetermined path to the robot, to control the robot to carry the PCB to be tested from the depot to the determined open shielding box, and place the PCB to be tested into the determined open shielding box.

2. The apparatus as described in claim 1, each PCB comprising a unique identifier, a testing software being installed in the one or more electronic devices to test the PCB to be tested and generate a testing result corresponding to the unique identifier of the PCB, before the testing software tests, the unique identifier of the PCB to be tested being transmitted to the testing software, wherein the apparatus further comprises a testing module to close the determined open shielding box after a predetermined time duration after the control module transmits the control signal to the robot, and control the testing software to test the PCB to be tested and generate the testing result corresponding to the unique identifier of the PCB.

3. The apparatus as described in claim 2, wherein the apparatus further comprises an executing module operable to determine the unique identifier of the closed shielding box of the tested PCB, and open the closed shielding box according to the determined unique identifier.

4. The apparatus as described in claim 3, wherein the testing module is further operable to remove the mark of the unique identifier of the closed shielding box from the storage system when the testing module closes the open shielding box, and the executing module is further operable to mark the determined unique identifier of the open shielding box in the storage system when the executing module opens the shielding box.

5. The apparatus as described in claim 1, wherein all the predetermined paths form a movement range of the robot, and the robot is controlled to move in the movement range of the robot, each point in the movement range of the robot corresponds to one set of coordinates in the Descartes coordinate system; the position determining module is further operable to determine the set of coordinates of the robot according to the position of the robot, and determine whether the determined set of coordinates of the robot is within the preset position range.

6. The apparatus as described in claim 5, wherein the position determining module is operable to obtain the position of the robot from a positioning unit employed in the robot and determine the set of coordinates of the robot according to the obtained position of the robot.

7. The apparatus as described in claim 5, wherein the position determining module is operable to obtain the position of the robot from a detection unit which covers a ground corresponding to the movement range of the robot and determine the set of coordinates of the robot according to the position of the robot.

8. A printed circuit board testing method comprising:
providing a storage system storing a unique identifier of each shielding box and a predetermined path of each shielding box; the unique identifier of each of the shielding boxes being capable of being marked to identify that the shielding box is open; the predetermined path of each shielding box being a shortest path that a robot moves along from a depot which stores a plurality of PCBs to be tested to the corresponding shielding box; the position of the depot being a preset position range;
determining a position of the robot at predetermined time interval and determining whether the determined position of the robot is within the preset position range;
determining whether one or more shielding boxes are open according to the unique identifiers of the shielding boxes when the determined position of the robot is within the preset position range;
obtaining the predetermined path of each determined open shielding box from the storage system when one or more shielding boxes are open; and
determining a shortest predetermined path among the obtained predetermined paths, and the open shielding box corresponding to the shortest predetermined path, and transmitting a control signal comprising the determined shortest predetermined path to the robot, to control the robot to carry the PCB to be tested from the depot to the determined open shielding box, and place the PCB to be tested into the determined open shielding box.

9. The printed circuit board testing method as described in claim 8, each PCB comprising a unique identifier, a testing software being installed in the one or more electronic devices to test the PCB to be tested and generate a testing result corresponding to the unique identifier of the PCB, before the testing software tests, the unique identifier of the PCB to be tested being transmitted to the testing software, wherein the method further comprises:
closing the determined open shielding box after a predetermined time duration after transmitting the control signal to the robot, and controlling the testing software to test the PCB to be tested and generate the testing result corresponding to the unique identifier of the PCB.

10. The printed circuit board testing method as described in claim 9, wherein the method further comprises:
determining the unique identifier of the closed shielding box of the tested PCB, and opening the closed shielding box according to the determined unique identifier.

11. The printed circuit board testing method as described in claim 10, wherein the method further comprises:
removing the mark of the unique identifier of the closed shielding box from the storage system upon closing the open shielding box; and
marking the determined unique identifier of the open shielding box in the storage system upon opening the shielding box.

12. The printed circuit board testing method as described in claim 8, all the predetermined paths forming a movement range of the robot, and the robot being controlled to move in the movement range of the robot, each point in the movement range of the robot corresponding to one set of coordinates in the Descartes coordinate system; wherein the method further comprises:

determining the set of coordinates of the robot according to the position of the robot, and determining whether the determined set of coordinates of the robot is within the preset position range.

13. The printed circuit board testing method as described in claim 12, wherein the method further comprises:
obtaining the position of the robot from a positioning unit employed in the robot and determining the set of coordinates of the robot according to the obtained position of the robot.

14. The printed circuit board testing method as described in claim 12, wherein the method further comprises:
obtaining the position of the robot from a detection unit which covers a ground corresponding to the movement range of the robot and determining the set of coordinates of the robot according to the position of the robot.

15. A non-transitory storage system storing a set of instructions, the set of instructions capable of being executed by a processor of an apparatus, causing the apparatus to perform a printed circuit board testing method, the method comprising:
providing a storage system storing the unique identifier of each shielding box and a predetermined path of each shielding box; the unique identifier of each of the shielding boxes being capable of being marked to identify that the shielding box is open; the predetermined path of each shielding box being a shortest path that a robot moves along from a depot which stores a plurality of PCBs to be tested to the corresponding shielding box; the position of the depot being a preset position range;
determining a position of the robot at predetermined time interval and determining whether the determined position of the robot is within the preset position range;
determining whether one or more shielding boxes are open according to the unique identifiers of the shielding boxes when the determined position of the robot is within the preset position range;
obtaining the predetermined path of each determined open shielding box from the storage system when one or more shielding boxes are open; and
determining a shortest predetermined path among the obtained predetermined paths, and the open shielding box corresponding to the shortest predetermined path, and transmitting a control signal comprising the determined shortest predetermined path to the robot, to control the robot to carry the PCB to be tested from the depot to the determined open shielding box and place the PCB to be tested into the determined open shielding box.

16. The non-transitory storage system as described in claim 15, each PCB comprising a unique identifier, a testing software being installed in the one or more electronic devices to test the PCB to be tested and generate a testing result corresponding to the unique identifier of the PCB, before the testing software tests, the unique identifier of the PCB to be tested being transmitted to the testing software, wherein the method further comprises:
closing the determined open shielding box after a predetermined time duration after transmitting the control signal to the robot, and controlling the testing software to test the PCB to be tested and generate the testing result corresponding to the unique identifier of the PCB.

17. The non-transitory storage system as described in claim 16, wherein the method further comprises:
determining the unique identifier of the closed shielding box of the tested PCB, and opening the closed shielding box according to the determined unique identifier.

18. The non-transitory storage system as described in claim 15, all the predetermined paths forming a movement range of the robot, and the robot being controlled to move in the movement range of the robot, each point in the movement range of the robot corresponding to one set of coordinates in the Descartes coordinate system; wherein the method further comprises:
determining the set of coordinates of the robot according to the position of the robot, and determining whether the determined set of coordinates of the robot is within the preset position range.

19. The non-transitory storage system as described in claim 18, wherein the method further comprises:
obtaining the position of the robot from a positioning unit employed in the robot and determining the set of coordinates of the robot according to the obtained position of the robot.

20. The non-transitory storage system as described in claim 18, wherein the method further comprises:
obtaining the position of the robot from a detection unit which covers a ground corresponding to the movement range of the robot and determining the set of coordinates of the robot according to the position of the robot.

* * * * *